United States Patent
Duby et al.

(10) Patent No.: US 10,256,820 B2
(45) Date of Patent: Apr. 9, 2019

(54) LEVEL SHIFTER

(71) Applicant: ARM Limited, Cambridge (GB)

(72) Inventors: Jean-Claude Duby, Saint Egreve (FR); Mikael Rien, Bernin (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/081,814

(22) Filed: Mar. 25, 2016

(65) Prior Publication Data

US 2016/0211847 A1     Jul. 21, 2016

Related U.S. Application Data

(63) Continuation-in-part of application No. 14/814,180, filed on Jul. 30, 2015, now Pat. No. 9,806,716.

(30) Foreign Application Priority Data

Jul. 30, 2014   (GB) .................................. 1413492.8

(51) Int. Cl.
  *H03K 19/003* (2006.01)
  *H03K 19/0185* (2006.01)
  (Continued)

(52) U.S. Cl.
  CPC ... *H03K 19/00315* (2013.01); *H03K 3/35613* (2013.01); *H03K 3/356182* (2013.01);
  (Continued)

(58) Field of Classification Search
  CPC ....... H03K 3/356104; H03K 17/08104; H03K 17/102; H03K 19/018521;
  (Continued)

(56) References Cited

U.S. PATENT DOCUMENTS 6,084,430 A    7/2000  Wayner
6,147,540 A   11/2000  Coddington
  (Continued)

FOREIGN PATENT DOCUMENTS

EP       2680441 A2    1/2014

OTHER PUBLICATIONS

UKIPO Search Report; GB 1413492.8; dated Jan. 13, 2015.
(Continued)

*Primary Examiner* — Seokjin Kim
(74) *Attorney, Agent, or Firm* — Pramudji Law Group PLLC; Ari Pramudji

(57) ABSTRACT

Various implementations described herein are directed to a circuit for translating an input signal from a source voltage domain to an output signal for a destination voltage domain that is is different than the source voltage domain. The circuit may include a level shifting portion configured to operate with a supply voltage that exceeds a stressing threshold of one or more components within the circuit. The level shifting portion may be configured to generate the output signal for the destination voltage domain based on the input signal and a power management signal. The circuit may include an isolating portion configured to isolate the one or more components from the supply voltage during activation and deactivation of the circuit based on the power management signal.

15 Claims, 4 Drawing Sheets

(51) Int. Cl.
*H03K 19/00* (2006.01)
*H03K 3/356* (2006.01)

(52) U.S. Cl.
CPC ... *H03K 19/0013* (2013.01); *H03K 19/00384* (2013.01); *H03K 19/018521* (2013.01)

(58) Field of Classification Search
CPC ....... H03K 3/356165; H03K 3/356113; H03K 3/012; H03K 19/0016; H03K 3/35613; G09G 3/20; G09G 2310/0289; G09G 2330/02
USPC ...................................... 326/62–81; 327/333
See application file for complete search history.

(56) References Cited

U.S. PATENT DOCUMENTS

| | | | |
|---|---|---|---|
| 6,346,829 B1 | 2/2002 | Coddington | |
| 6,700,407 B1* | 3/2004 | Wert ................ | H03K 3/356113 326/62 |
| 6,965,251 B1 | 11/2005 | Tran et al. | |
| 7,173,472 B2 | 2/2007 | Chen et al. | |
| 8,258,848 B2* | 9/2012 | Chen ................. | H03K 3/35613 326/68 |
| 8,598,936 B2 | 12/2013 | Kuge | |
| 2006/0255835 A1* | 11/2006 | Cordoba ............ | H03K 3/02335 326/68 |
| 2010/0264976 A1 | 10/2010 | Duby et al. | |
| 2011/0102383 A1* | 5/2011 | Cho ................. | H03K 3/356113 345/204 |
| 2012/0133416 A1* | 5/2012 | Ogawa ............... | H03K 3/35613 327/333 |
| 2014/0002146 A1* | 1/2014 | Kim ................. | H03K 17/08104 327/109 |
| 2014/0097888 A1 | 4/2014 | Lee | |
| 2014/0117953 A1 | 5/2014 | Hoefler et al. | |
| 2016/0036445 A1 | 2/2016 | Dey et al. | |
| 2017/0041002 A1 | 2/2017 | Dey et al. | |

OTHER PUBLICATIONS

UKIPO Search Report; GB 1413490.2; dated Jan. 14, 2015.
Lee, et al.; Wide-Range 5.0/3.3/1.8-V I/O Buffer Using 0.35-µm 3.3-V CMOS Technology; IEEE Transactions on Circuits and Systems I, Regular Papers; vol. 56, No. 4; Apr. 2009.
Chen, et la.; An Output Buffer for 3.3-V Applications in a 0.13-µm 1/2.5-V CMOS Process; IEEE Transactions on Circuits and Systems II, Express Briefs; vol. 54, No. 1; Jan. 2007.
Annema, et al.; 5.5-V I/O in a 2.5-V 0.25-µm CMOS Technology; IEEE Journal of Solid-State Circuits; vol. 36, No. 3; Mar. 2001.

* cited by examiner

LEVEL SHIFTER

CROSS-REFERENCE TO RELATED APPLICATIONS

This application is a continuation-in-part of U.S. application Ser. No. 14/814,180, filed Jul. 30, 2015, which claims priority to GB 1413492.8, filed Jul. 30, 2014. These applications are incorporated by reference in their entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

FIG. 1 illustrates a conventional level shifter 100 as known in the art. In latest technologies, the trend is to lower core voltage (VDD) of SOC (System On a Chip) devices to reduce power consumption. In general purpose I/O (input/output) interfaces, standard level shifter designs only use thick oxide devices 102. This is done to avoid risk of having some transistors (N0, N1) stressed above technology boundaries.

In some I/O interfaces, the conventional level shifter 100 refers to a circuit that is typically used to translate a signal from VDD (core supply domain) to DVDD (I/O supply domain). However, when the core voltage VDD is substantially low (e.g., 0.5V and below), VDD is near or below a threshold voltage (VTh) of thick oxide transistors (N0, N1).

In reference to FIG. 1, the VTh of the thick oxide transistors N0 and N1 can be higher than the input voltage IN, INB received at their gates. Therefore, the conventional level shifter 100 is typically no longer functional when the core voltage VDD is substantially low (e.g., 0.5V and below), and in some cases, the conventional level shifter 100 can fail to operate or function properly at substantially low voltages.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to a level shifter or level shifting circuit, such as, e.g., a self-protected low power and/or ultra-low voltage I/O (input/output) level shifter circuit. In some instances, low-to-high level shifter circuitry may be provided to translate a signal (e.g., an input signal) from a core voltage (e.g., a supply voltage in a source voltage domain VDD) to an I/O voltage (e.g., a supply voltage in a destination voltage domain DVDD). This level shifter circuitry may operate at ultra-low core voltage (e.g., down to 0.4V), without external reference signals (e.g., reference voltage). Thus, in some cases, this level shifter circuitry may operate at low power, e.g., with less DC (direct current) consumption. Further, this level shifter circuitry may use core components or devices in an I/O supplied voltage domain. When combined with a selectively activated power management signal SNS, this level shifter circuitry may thus ensure that core components and devices are not exposed to high electrical stress.

Various implementations of a level shifter or level shifting circuit will now be described in greater detail herein with reference to FIGS. 2A-3.

Figure 1:
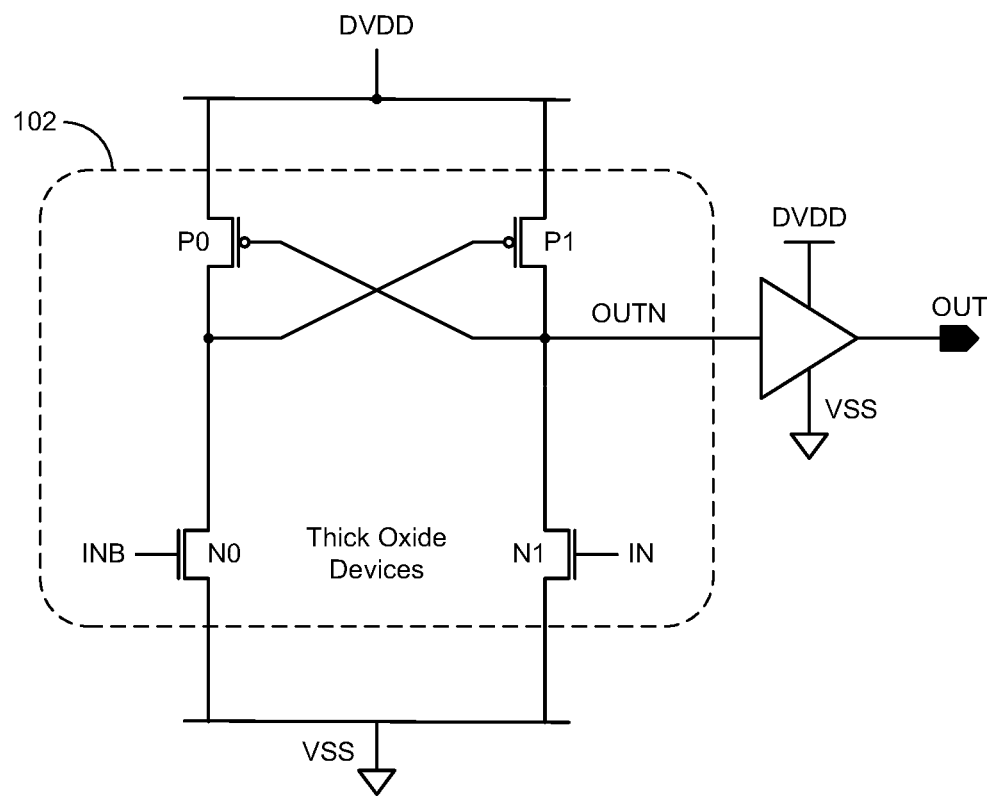
FIG. 1 illustrates a conventional level shifter as known in the art.
Figure 2A:
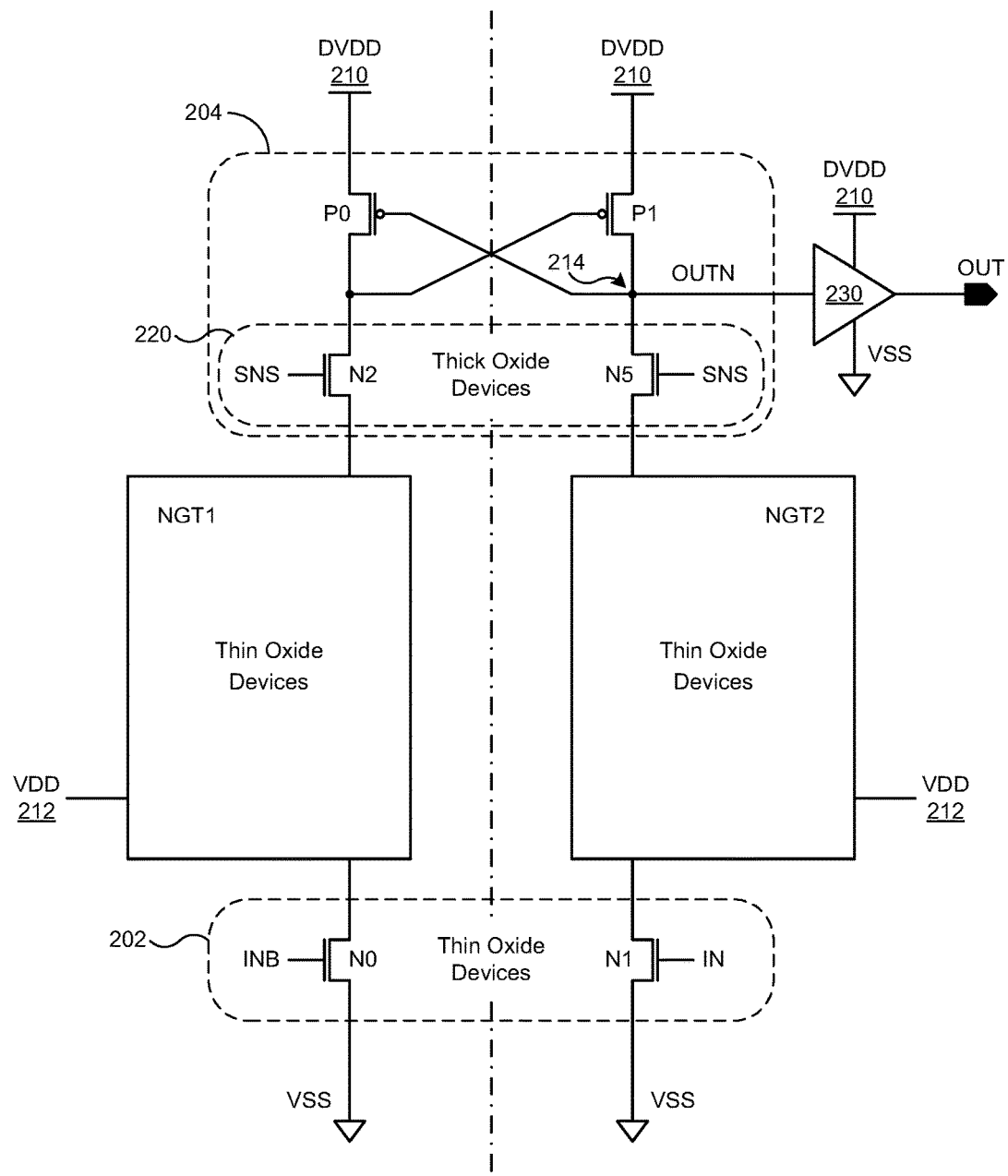
FIGS. 2A-2B illustrate various diagrams of a level shifter in accordance with various implementations described herein.
Figure 2B:
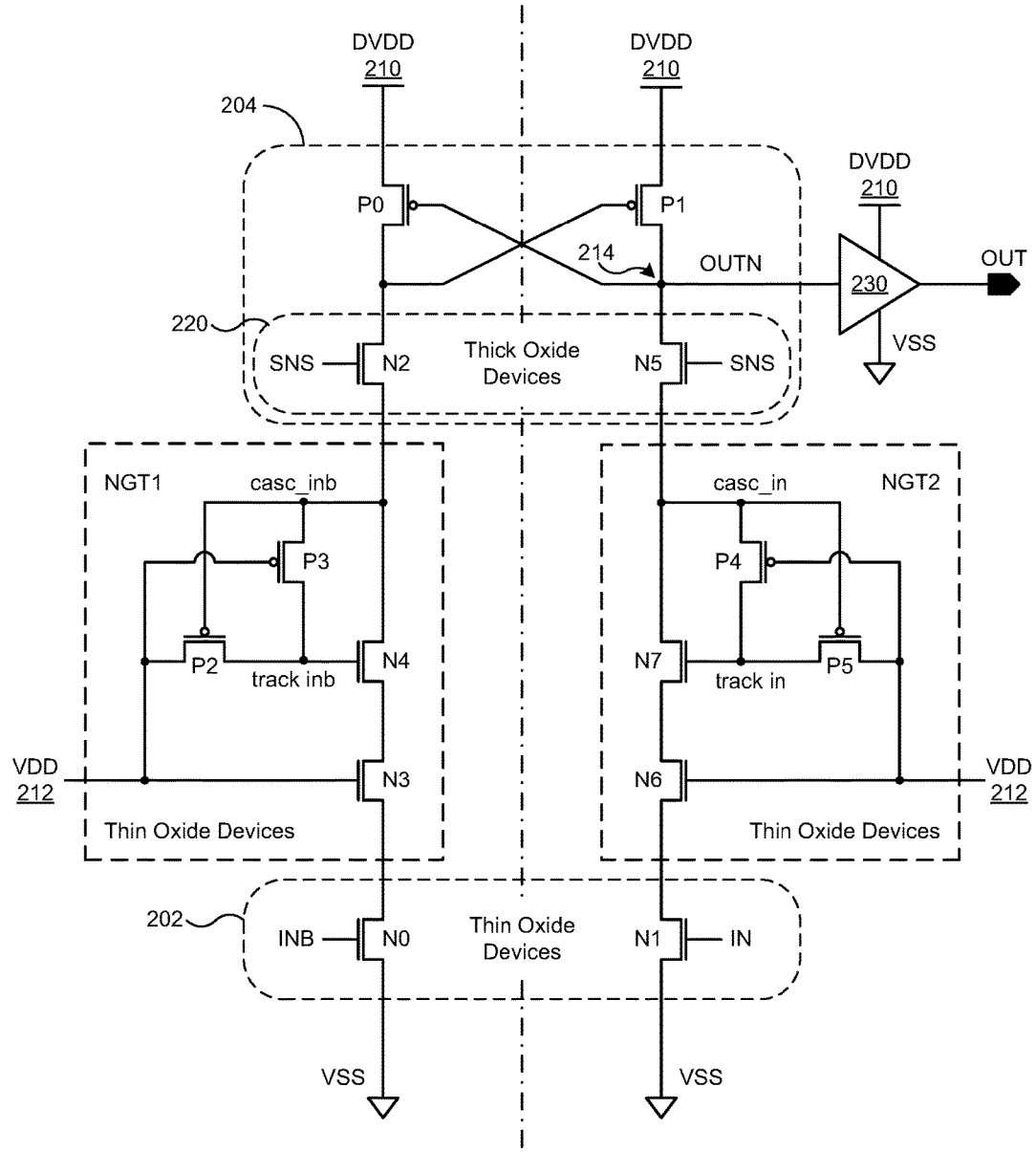

FIGS. 2A-2B illustrate various diagrams of a level shifter 200 in accordance with various implementations described herein. In particular, FIG. 2A illustrates a block diagram view 200A of a simplified circuit schematic of the level shifter 200, and FIG. 2B illustrates another diagram view 200B of a detailed circuit schematic of the level shifter 200 in accordance with various implementations described herein.

The level shifter 200 of FIGS. 2A-2B may be implemented as an integrated circuit, a discrete circuit, as components on a printed circuit board (PCB), and/or any other similar type of circuitry. In some cases, the level shifter 200 may be implemented as a device, apparatus, etc. having an integrated circuit, components on a printed circuit board (PCB), and/or any other type of similar circuitry. Generally, in reference to manufacturing and fabrication processes, electronic designers may employ various techniques to design integrated circuits, PCBs, and any other similar circuitry, such as physical chips and/or physical layers, to implement the level shifter 200 and/or techniques thereof.

As shown in the circuit of FIG. 2A, the level shifter 200 may be configured for translating input signals IN, INB from a source voltage domain VDD to output signals OUT, OUTN for a destination voltage domain DVDD. In some cases, the level shifter 200 may be configured to operate with a first voltage 210 in the destination voltage domain DVDD that exceeds a stressing threshold of one or more thin oxide components or devices (e.g., thin oxide transistors N0, N1) within the circuit. The level shifter 200 may be configured to generate the output signals OUT, OUTN for the destination voltage domain DVDD based on the input signals IN, INB and a control signal SNS. The control signal SNS may be referred to as a power management signal SNS.

In some implementations, the destination voltage domain DVDD is different than the source voltage domain VDD. For instance, the destination voltage domain DVDD may refer to operating voltages of greater than 0.5V, and the source voltage domain VDD may refer to operating voltages of less than or equal to 0.5V. In some cases, components in the source voltage domain VDD may operate between a supply voltage of, e.g., 0.5V and ground (0V, GND, VSS). The level shifter 200 may generate an output signal OUT, OUTN for components in the destination voltage domain DVDD. The components in the destination voltage domain DVDD may operate between a different supply voltage and ground (0V, GND, VSS). For instance, components in the destination voltage domain DVDD may operate with a supply voltage of approximately 1.8V, 2.5V, 3.3V, depending on the operating mode of those particular components.

In the circuit of FIG. 2A, the level shifter 200 may include a plurality of thick oxide transistors 204 including, e.g., a cross-coupled pair of thick oxide transistors P0, P1 that are configured to receive the first voltage 210 in the destination voltage domain DVDD. In some implementations, the thick oxide transistors P0, P1 may be p-type metal-oxide-semiconductor (PMOS) transistors. Further, in some implementations, the input signals IN, INB may include differential input signals, and the one or more thin oxide components or devices N0, N1 of the level shifter 200 may include a differential pair of thin oxide transistors that are configured to receive the input signals IN, INB, which may include differential input signals.

In the circuit of FIG. 2A, gate trackers NGT1, NGT2 may be configured to operate with a second voltage 212 in the source voltage domain VDD. The gate trackers NGT1, NGT2 may be configured to ensure that a voltage drop across the one or more thin oxide transistors N0, N1 is less than or equal to the stressing threshold. Further, in some implementations, the thin oxide transistors N0, N1 may include n-type metal-oxide-semiconductor (NMOS) transistors.

In some cases, to be able to keep the functionality at ultra-low VDD values, the level shifter 200 may be configured to use thin oxide transistors N0, N1 (that have a lower VTh than conventional thick oxide devices) to handle the input signal IN, INB in the VDD power domain. However, by using thin oxide transistors N0, N1, the first voltage 210 seen by these devices N0, N1 should be taken into account, because these devices N0, N1 may not handle a voltage in a range of the destination voltage domain DVDD. Thus, the gate trackers NGT1, NGT2 may be configured to provide a cascaded MOS structure that may reduce the first voltage 210 seen by the thin oxide transistors N0, N1. FIG. 2B provides a more detailed view of the gate trackers NGT1, NGT2.

Further, in the circuit of FIG. 2A, the level shifter 200 may include isolators 220, wherein the plurality of thick oxide transistors 204 may include a pair of thick oxide transistors N2, N5 that are configured as isolation devices. For instance, the isolators 220 may be configured to isolate the one or more thin oxide transistors N0, N1 and the gate trackers NGT1, NGT2 from the first voltage 210 (in the destination voltage domain DVDD) during activation and deactivation of the circuit based on the control signal or the power management signal SNS. The isolators 220 may include the thick oxide transistors N2, N5 that are coupled between the cross-coupled pair of thick oxide transistors P0, P1 and the gate trackers NGT1, NGT2. The thick oxide transistors N2, N5 may include n-type metal-oxide-semiconductor (NMOS) transistors that may be configured to receive the first voltage 210 in the destination voltage domain DVDD. Further, the thin oxide transistors N0, N1 may include n-type MOS (NMOS) transistors.

As shown in FIG. 2A, the level shifter circuit 200 may include an inverter 230 coupled to an output node 214. In some implementations, the inverter 230 may be configured to receive the output signal OUTN from the output node 214, invert the received output signal OUTN to another output signal OUT, and provide the output signal OUT for the destination voltage domain DVDD. In some cases, as shown, the inverter 230 may be coupled between the first voltage DVDD 210 and ground VSS, and thus, the inverter 230 may be biased with the first voltage DVDD 210. Further, in some cases, the received output signal OUTN may be in the destination voltage domain DVDD, and as such, the inverter 230 may be used or configured to shape the output signal OUT.

Referring now to FIG. 2B, the gate trackers NGT1, NGT2 may include a plurality of transistors that are configured and/or arranged to operate with the second voltage 212 in the source voltage domain VDD. In some cases, the plurality of transistors may include thin oxide transistors. As shown, a first gate tracker NGT1 may include a first plurality of thin oxide transistors P2, P3, N3, N4, and a second gate tracker NGT2 may include a second plurality of thin oxide transistors P4, P5, N6, N7. In some cases, the thin oxide transistors P2, P3 P4, P5 may be implemented with PMOS transistors, and the thin oxide transistors N3, N4, N6, N7 may implemented with NMOS transistors.

In some implementations, the PMOS transistors P2, P3, of the first gate tracker NGT1 and the PMOS transistors P4, P5 of the second gate tracker NGT2 may be implemented with thick oxide devices. Generally, the use of these thick oxide devices for the PMOS transistors P2, P3, P4, P5 may depend on the particular technology.

As shown in the circuit of FIG. 2B, the plurality of transistors in each of the the gate trackers NGT1, NGT2 are arranged to ensure that the voltage drop across the one or more thin oxide transistors P2, P3, N3, N4 and P4, P5, N6, N7 is less than or equal to the stressing threshold. For instance, to handle the stress of the first voltage 210 in the destination voltage domain DVDD without adding some DC consumption, the design of the level shifter 200 is configured to implement and use a thin oxide triple stacked MOS structure, with gate tracking feature (track inb, track in) to avoid reliability issues. In some cases, the circuits of the gate trackers NGT1, NGT2 having this gate tracking feature may be referred to as as NGT (NMOS gate tracking) devices. Accordingly, as shown in FIG. 2B, the plurality of thin oxide transistors P2, P3, N3, N4 and P4, P5, N6, N7 may be implemented as a thin oxide triple stacked MOS transistor structure.

As described herein in reference to FIGS. 2A-2B, transistors N0, N1, N3, N4, P2, and P3 may be implemented with thin oxide devices, and transistors N2, N5, P0, and P1 may be implemented with thick oxide devices. As shown in the circuit of FIG. 2B, the gate tracker NGT1 may include the thin oxide transistor P2. During operation, the thick oxide transistor N2 may be used to reduce the voltage seen at the gate of the thin oxide transistor P2 and to reduce the drain-source voltage of the thin oxide transistors P3/N4 by $1 \, VTN_{(thick \, oxide)}$: $V[casc\_inb] \, max = DVDD - 1 \, VTN_{(thick \, oxide)}$. Further, the gate tracker NGT2 may include the thin oxide transistor P5. During operation, the thick oxide transistor N5 may be used to reduce the voltage seen at the gate of the thin oxide transistor P5 and to reduce the drain-source voltage of the thin oxide transistors P4/N7 by $1 \, VTN_{(thick \, oxide)}$: $V[casc\_in] \, max = DVDD - 1 \, VTN_{(thick \, oxide)}$. In some cases, due to the NGT1 circuit, the gate voltage of N4 (V[track_inb]) may be at a maximum between V[casc_inb] and VDD. Further, in some cases, due to the NGT2 circuit, the gate voltage of N7 (V[track_inb]) may be at a maximum between V[casc_in] and VDD The following calculations are provided for reference:

$$P2/P3 : VGD = V[casc\_inb] = DVDD - 1 VTN_{(thick \, oxide)}.$$

$$P2 : VDS = DVDD - 1 VTN_{(thick \, oxide)}.$$

$$N3 : VGD = DVDD - 1 VTN_{(thick \, oxide)} - 1 VTN_{(thin \, oxide)}.$$

In some implementations, the NGT1 and NGT2 circuits may prevent or at least inhibit exposure of the thin oxide devices P2, P3, N3, N4, N0 and P4, P5, N6, N7, N1 to overstress voltage in DC and transient conditions. The thin oxide device voltages (VGS, VGD, VDS) may be kept below a maximum VDD allowed by the technology to prevent or at least inhibit reliability issues. However, depending on the power sequencing (DVDD first, VDD first, etc.), there may be some cases where the thin oxide devices are directly exposed to huge overstress during the ramp up of the power supplies. Thus, to implement this level shifter design with GPIO (general-purpose input/output) libraries, the NGT1 and NGT2 circuits should not be based on VDD voltage during power-up and power-down of the level shifter circuit 200. For instance, an issue may arise when DVDD is ON and VDD is equal to 0 (e.g., OFF, in core-off mode). In this scenario, some thin oxide devices may see an overstress beyond what is acceptable for thin oxide devices, which may thus result in causing some reliability issues.

To circumvent this reliability issue, an idea of the present disclosure is to use the power management signal SNS in combination with the NGT1 and NGT2 circuits to remove or at least reduce a risk of reliability issues during power-up and power-down of the level shifter circuit 200. This control signal or power management signal SNS may be in the destination voltage domain DVDD and may be applied to the gate of the thick oxide transistors N2 and N5 of the isolator 220. In some cases, the power management signal SNS may be used as a control signal instead of using a voltage in the destination voltage domain DVDD. For instance, during operation of this power gating feature, when VDD is OFF and DVDD is ON, the power management signal SNS is kept at zero. Accordingly, in some cases, this power gating feature may be used to isolate the thin oxide devices P2, P3, N3, N4, N0 and P4, P5, N6, N7, N1 from DVDD signals and may thus prevent or at least inhibit any overstress issue on these devices.

In various implementations, the power management signal SNS (or control signal) may be generated by a dedicated cell that may be present in some I/O rings. By combining thin oxide NGT circuits and a specific power management implementation, the level shifter circuit 200 as described herein may be configured to keep the functionality at substantially low VDD, without any additional DC consumption (i.e., low power), without adverse reliability issues, and without power management constraints. In some cases, the power management signal SNS is a VDD sensing signal. For instance, when DVDD (e.g., 1.8V) is ON, and VDD is OFF, this signal may stay low, and once VDD reaches a particular voltage, the SNS signal may switch from low to high (DVDD).

Figure 3:
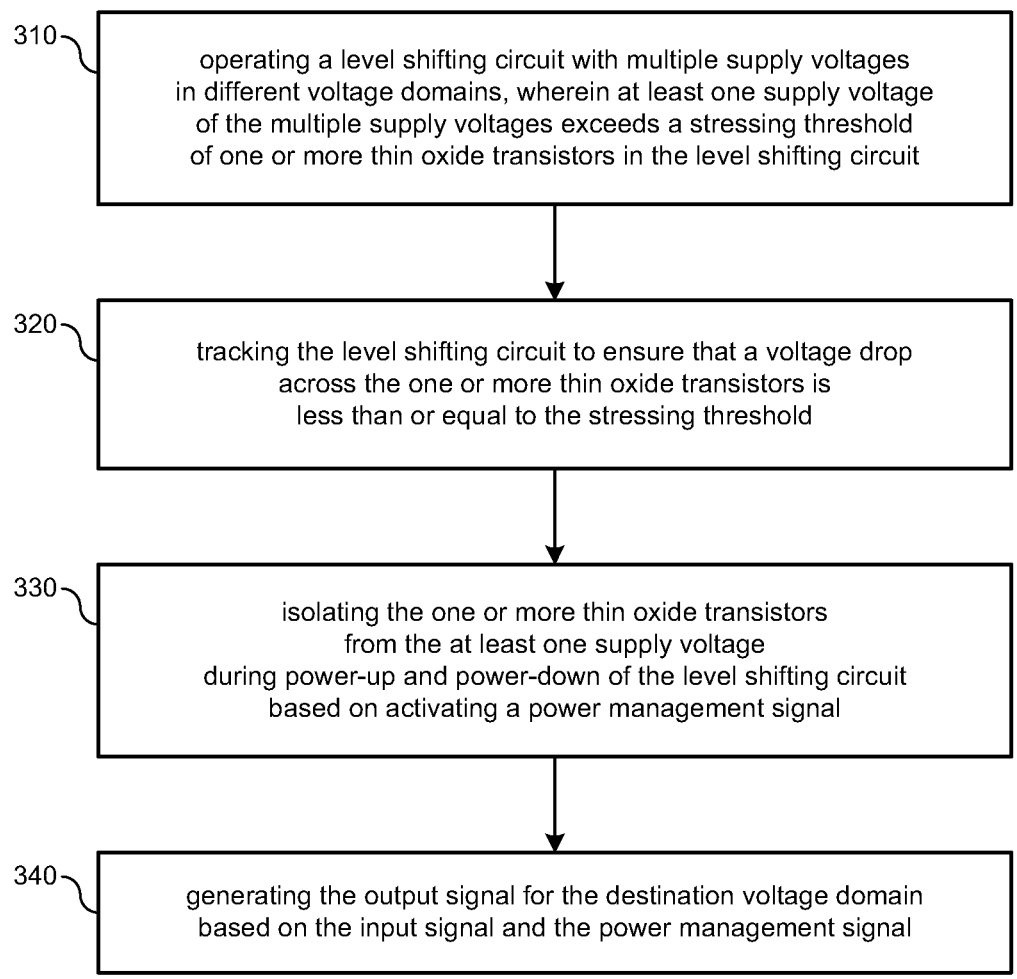
FIG. 3 illustrates a method for translating an input signal from a source voltage domain to an output signal for a destination voltage domain in accordance with various implementations described herein.

FIG. 3 illustrates a method 300 for translating an input signal from a source voltage domain to an output signal for a destination voltage domain in accordance with various implementations described herein.

It should be understood that even though method 300 may indicate a particular order of execution of operations, in some instances, various certain portions of the operations may be executed in a different order, and on different systems. In some other instances, additional operations or steps may be added to and/or omitted from method 300. The method 300 may be implemented in hardware and/or software. If implemented in hardware, the method 300 may be implemented with various circuit components, such as described herein above in reference to FIGS. 2A-2B. If implemented in software, the method 300 may be implemented as a program or software instruction process that may be configured to provide level shifting as described herein. Further, if implemented in software, instructions related to implementing the method 300 may be stored in memory and/or a database. For instance, a computer or various other computing devices having a processor and memory may be configured to perform method 300.

In some implementations, method 300 is directed to translating an input signal from a source voltage domain (VDD) to an output signal for a destination voltage domain (DVDD). For instance, at block 310, method 300 may operate a level shifting circuit with multiple supply voltages in different voltage domains, such as the source voltage domain (VDD) and the destination voltage domain (DVDD). In some cases, at least one supply voltage of the multiple supply voltages (e.g., DVDD) exceeds a stressing threshold of one or more thin oxide transistors in the level shifting circuit.

In some implementations, the level shifter may include a cross-coupled pair of thick oxide transistors that are configured to receive a voltage in the destination voltage domain (DVDD). Further, the input signal may include differential input signals, and the level shifter may include a differential pair of thin oxide transistors that are configured to receive the differential input signals.

At block 320, method 300 may track the level shifting circuit to ensure that a voltage drop across the one or more thin oxide transistors is less than or equal to the stressing threshold. In some implementations, method 300 may utilize multiple transistors configured to operate with the second voltage in the source voltage domain, and further, the multiple transistors may be arranged to ensure that the voltage drop across the one or more thin oxide transistors is less than or equal to the stressing threshold. The multiple transistors may include a thin oxide triple stacked MOS (metal-oxide-semiconductor) transistor structure.

At block 330, method 300 may isolate the one or more thin oxide transistors from the at least one supply voltage during power-up and power-down of the level shifting circuit based on activating a power management signal. In some implementations, a pair of thick oxide transistors that are configured to activate based on the power management signal may be utilized for providing isolation between the cross-coupled pair of thick oxide transistors and the multiple transistors used for tracking.

At block 340, method 300 may generate the output signal for the destination voltage domain based on the input signal and the power management signal. Further, in some implementations, method 300 may include receiving the output signal from the level shifter, comparing the received output signal to a voltage in the destination voltage domain DVDD, and providing a translated output signal for the destination voltage domain DVDD.

Described herein are various implementations of a circuit for translating an input signal from a source voltage domain to an output signal for a destination voltage domain. The circuit may include a level shifter configured to operate with a first voltage that exceeds a stressing threshold of one or more thin oxide transistors within the circuit. The level shifter may be further configured to generate the output signal for the destination voltage domain based on the input signal and a control signal. The circuit may include a gate tracker configured to operate with a second voltage in the source voltage domain. The gate tracker may be configured to ensure that a voltage drop across the one or more thin oxide transistors is less than or equal to the stressing threshold. The circuit may include an isolator configured to isolate the one or more thin oxide transistors from the first voltage during activation and deactivation of the circuit based on the control signal.

Described herein are various implementations of a circuit for translating an input signal from a source voltage domain to an output signal for a destination voltage domain that is is different than the source voltage domain. The circuit may include a level shifting portion configured to operate with a supply voltage that exceeds a stressing threshold of one or more components within the circuit. The level shifting portion may be configured to generate the output signal for the destination voltage domain based on the input signal and a power management signal. The circuit may include an isolating portion configured to isolate the one or more components from the supply voltage during activation and deactivation of the circuit based on the power management signal.

Described herein are various implementations of a method for translating an input signal from a source voltage domain to an output signal for a destination voltage domain. The method may include operating a level shifting circuit with multiple supply voltages in different voltage domains. At least one supply voltage of the multiple supply voltages exceeds a stressing threshold of one or more thin oxide transistors in the level shifting circuit. The method may include tracking the level shifting circuit to ensure that a voltage drop across the one or more thin oxide transistors is less than or equal to the stressing threshold. The method may include isolating the one or more thin oxide transistors from the at least one supply voltage during power-up and power-down of the level shifting circuit based on activating a power management signal. The method may include generating the output signal for the destination voltage domain based on the input signal and the power management signal.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit for translating an input signal from a source voltage domain to an output signal for a destination voltage domain, the circuit comprising:
    a level shifter configured to operate with a first voltage that exceeds a stressing threshold of one or more thin oxide transistors within the circuit, wherein the source voltage domain includes operating voltages of less than 0.5 volts, and wherein the one or more thin oxide transistors operate within the operating voltages of less than 0.5 volts, and wherein the level shifter is further configured to generate the output signal for the destination voltage domain based on the input signal and a control signal, and wherein the level shifter comprises a cross-coupled pair of thick oxide transistors that are configured to receive the first voltage;
    one or more gate trackers configured to operate with a second voltage in the source voltage domain, wherein the one or more gate trackers is configured to ensure that a voltage drop across the one or more thin oxide transistors is less than or equal to the stressing threshold, wherein the one or more gate trackers comprises a first thin oxide P-type transistor; and
    an isolator having a pair of thick oxide N-type transistors that are arranged to isolate the one or more thin oxide transistors from the first voltage during activation and deactivation of the circuit based on the control signal, wherein the pair of thick oxide N-type transistors are coupled between the cross-coupled pair of thick oxide transistors and the one or more gate trackers, and wherein a respective thick oxide N-type transistor of the isolator is configured to at least reduce a gate voltage of the first thin oxide P-type transistor.

2. The circuit of claim 1, wherein the destination voltage domain is different than the source voltage domain, and wherein the first voltage is in the destination voltage domain.

3. The circuit of claim 1, wherein the destination voltage domain refers to operating voltages of greater than 0.5 volts.

4. The circuit of claim 1, wherein the control signal comprises a power management signal.

5. The circuit of claim 1, wherein the input signal comprises differential input signals, and wherein the level shifter comprises a differential pair of thin oxide transistors that are configured to receive the differential input signals.

6. The circuit of claim 1, wherein the one or more gate trackers comprises a plurality of transistors configured to operate with the second voltage in the source voltage domain.

7. The circuit of claim 6, wherein the plurality of transistors are arranged to ensure that the voltage drop across the one or more thin oxide transistors is less than or equal to the stressing threshold.

8. The circuit of claim 7, wherein the plurality of transistors comprises a thin oxide triple stacked MOS (metal-oxide-semiconductor) transistor structure.

9. The circuit of claim 1, further comprising an inverter configured to receive the output signal from the level shifter, invert the received output signal to another output signal, and provide the another output signal for the destination voltage domain.

10. A circuit for translating an input signal from a source voltage domain to an output signal for a destination voltage domain that is different than the source voltage domain, the circuit comprising:
    a level shifting portion configured to operate with a supply voltage that exceeds a stressing threshold of one or more components within the circuit, wherein the level shifting portion is configured to generate the output signal for the destination voltage domain based on the input signal from the source voltage domain and a power management signal, wherein the source voltage domain includes operating voltages of less than 0.5 volts, and wherein the one or more components operate within the operating voltages of less than 0.5 volts, wherein the level shifting portion comprises a cross-coupled pair of thick oxide transistors that are configured to receive the supply voltage;
    an isolating portion having a pair of thick oxide N-type transistors that are configured to isolate the one or more components from the supply voltage during activation and deactivation of the circuit based on the power management signal, wherein the isolating portion is coupled between the cross-coupled pair of thick oxide transistors and the one or more components, and wherein a respective thick oxide N-type transistor of the isolator is configured to at least reduce a gate voltage of a first thin oxide P-type transistor of the one or more components; and
    a gate tracking portion configured to operate with a core supply voltage in the source voltage domain, wherein the pair of thick oxide N-type transistors of the isolating portion are coupled between the cross-coupled pair of thick oxide transistors and the gate tracking portion.

11. The circuit of claim 10, wherein the one or more components comprise one or more thin oxide transistors including a differential pair of thin oxide transistors, wherein the input signal comprises differential input signals, and wherein the level shifting portion includes the differential pair of thin oxide transistors that are configured to receive the differential input signals.

12. The circuit of claim 10, wherein the gate tracking portion is associated with the one or more components of the level shifting circuit, and wherein the gate tracking portion is further configured to ensure that a voltage drop across the one or more components is less than or equal to the stressing threshold.

13. The circuit of claim 12, wherein the gate tracking portion comprises a plurality of thin oxide transistors arranged in a triple stacked MOS (metal-oxide-semiconductor) structure so as to operate with a core supply voltage in the source voltage domain.

14. The circuit of claim 10, further comprising an inverter configured to receive the output signal from the level shifting portion, invert the received output signal to another output signal, and provide the another output signal for the destination voltage domain.

15. A method for translating an input signal from a source voltage domain to an output signal for a destination voltage domain, the method comprising:
- operating a level shifting circuit with multiple supply voltages in different voltage domains, wherein at least one supply voltage of the multiple supply voltages exceeds a stressing threshold of one or more thin oxide transistors in the level shifting circuit, wherein the source voltage domain includes operating voltages of less than 0.5 volts, and the one or more thin oxide transistors operate within the operating voltages of less than 0.5 volts, wherein the level shifting circuit comprises a cross-coupled pair of thick oxide transistors that are configured to receive the at least one supply voltage;
- tracking the level shifting circuit with one or more gate trackers to ensure that a voltage drop across the one or more thin oxide transistors is less than or equal to the stressing threshold;
- isolating the one or more thin oxide transistors from the at least one supply voltage during power-up and power-down of the level shifting circuit based on activating a power management signal, wherein a pair of thick oxide N-type transistors are coupled between the cross-coupled pair of thick oxide transistors and the one or more thin oxide transistors for isolating the one or more thin oxide transistors from the at least one supply voltage based on the power management signal, and wherein the pair of thick oxide N-type transistors are coupled between the cross-coupled pair of thick oxide transistors and the one or more gate trackers, and wherein the pair of thick oxide N-type transistors are for at least reducing a gate voltage of a first thin oxide P-type transistor; and
- generating the output signal for the destination voltage domain based on the input signal from the source voltage domain and the power management signal.

* * * * *